(12) United States Patent
Chien

(10) Patent No.: US 11,034,032 B2
(45) Date of Patent: Jun. 15, 2021

(54) VACUUM ABSORPTION ASSEMBLY AND MANIPULATOR DEVICE

(71) Applicants: HKC CORPORATION LIMITED, Guangdong (CN); CHONGQING HKC OPTOELECTRONICS TECHNOLOGY CO., LTD., Chongqing (CN)

(72) Inventor: Chungkuang Chien, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 182 days.

(21) Appl. No.: 16/320,174

(22) PCT Filed: Jul. 26, 2017

(86) PCT No.: PCT/CN2017/094520
§ 371 (c)(1),
(2) Date: Jan. 24, 2019

(87) PCT Pub. No.: WO2018/223506
PCT Pub. Date: Dec. 13, 2018

(65) Prior Publication Data
US 2019/0263005 A1    Aug. 29, 2019

(30) Foreign Application Priority Data

Jun. 6, 2017 (CN) .......................... 201710418770.1

(51) Int. Cl.
*B25J 15/06* (2006.01)
*B25J 19/00* (2006.01)
*G03F 7/16* (2006.01)

(52) U.S. Cl.
CPC ....... *B25J 15/0616* (2013.01); *B25J 19/0054* (2013.01); *G03F 7/168* (2013.01)

(58) Field of Classification Search
CPC ............... B25J 15/0616; B25J 19/0054; B25J 15/0014; G03F 7/168; G02F 1/1303; G02F 1/133351
See application file for complete search history.

(56) References Cited

U.S. PATENT DOCUMENTS 6,299,431 B1 * 10/2001 Neter .................. B29C 45/7207
264/348
2005/0117110 A1 * 6/2005 Byun .................... G02F 1/1341
349/187

(Continued)

FOREIGN PATENT DOCUMENTS

CN          104210844          12/2014
CN          205674220          11/2016

(Continued)

OTHER PUBLICATIONS

Search Report of Chinese Serial No. 2017104187701 dated Feb. 16, 2019, 2 pages.

(Continued)

*Primary Examiner* — Stephan A Vu
(74) *Attorney, Agent, or Firm* — Westbridge IP LLC

(57) ABSTRACT

The present application provides a vacuum absorption assembly and a manipulator device. The vacuum absorption assembly includes: a manipulator pad; vacuum nozzles, disposed on the manipulator pad and configured to absorb a substrate; and further includes a cooling component, disposed in each of the vacuum nozzles and configured to cool the vacuum nozzle. Each vacuum nozzle defines therein an accommodation groove for installing the cooling component, and a cooling medium is introduced into the cooling component. The cooling component is a cooling pipeline, (Continued)

and the cooling medium is cooling gas. The cooling pipeline defines therein cooling pores configured to blow gas towards an absorption surface of the respective vacuum nozzle, and the respective vacuum nozzle defines therein exhaust openings configured to exhaust internal gas.

19 Claims, 4 Drawing Sheets

(56) References Cited

U.S. PATENT DOCUMENTS

| | | | | |
|---|---|---|---|---|
| 2015/0239131 | A1* | 8/2015 | Didiot | B25J 15/0616 |
| | | | | 53/203 |
| 2015/0360371 | A1* | 12/2015 | Harter | B25J 15/0625 |
| | | | | 294/186 |
| 2016/0271519 | A1* | 9/2016 | Harman | B01D 5/0036 |

FOREIGN PATENT DOCUMENTS

| | | | | |
|---|---|---|---|---|
| CN | 106378790 | | 2/2017 | |
| CN | 206201002 | | 5/2017 | |
| JP | 2006066417 | | 3/2006 | |
| KR | 20080011903 | | 2/2008 | |
| KR | 20130130758 A | * | 12/2013 | ........... C03B 17/064 |

OTHER PUBLICATIONS

Written Opinion and International Search Report of PCT/CN2017/094520 dated Mar. 14, 2018, 9 pages (English and Chinese).

* cited by examiner

VACUUM ABSORPTION ASSEMBLY AND MANIPULATOR DEVICE

CROSS-REFERENCE TO RELATED APPLICATIONS

This application is the International Application No. PCT/CN2017/094520 for entry into US national phase with an international filing date of Jul. 26, 2017, designating US, and claims priority to Chinese Patent Application No. 201710418770.1, filed on Jun. 6, 2017, the content of which is incorporated herein by reference in its entirety.

BACKGROUND OF THE INVENTION

Field of the Invention

The present application relates to the technical field of production of display devices, and more particularly to a vacuum absorption assembly and a manipulator device adopting the vacuum absorption assembly.

Description of Related Art

A substrate in a display device needs to enter a soft baking machine for baking after being coated with a photoresist. When transporting the substrate into the baking machine, a manipulator pad will be heated due to the heat transfer in the baking machine. In such case, the manipulator pad has a relatively high temperature.

However, when the manipulator returns to transport another substrate which has just finished the coating, the temperature of the pad will be transported to the glass substrate. The contact position will result in uneven thickness of the film under the action of the temperature difference, and produce uneven brightness and speckles during subsequent use.

BRIEF SUMMARY OF THE INVENTION

The present application provides a vacuum absorption assembly, which is intended to solve the problem that when t the coated glass substrate is transported by the manipulator for baking, the manipulator pad transports the temperature to the glass substrate, which results in uneven thickness of the glass substrate, and uneven brightness and speckles in use.

The present application adopts the following technical solution: a vacuum absorption assembly is provided, and vacuum absorption assembly comprises:
a manipulator pad;
vacuum nozzles, disposed on the manipulator pad and configured to absorb a substrate;
a cooling component, disposed in a respective vacuum nozzle and configured to cool the respective vacuum nozzle;
an accommodation groove, defined in the respective vacuum nozzle and configured to accommodate the cooling component; and
a cooling medium, filled within the cooling component and configured to cool the cooling component.

In one embodiment, the cooling component is a cooling pipeline, and the cooling medium comprises cooling gas.

In one embodiment, the cooling pipeline defines therein cooling pores configured to blow gas towards an absorption surface of the respective vacuum nozzle, and the respective vacuum nozzle defines therein exhaust openings configured to exhaust internal gas.

In one embodiment, the exhaust openings are uniformly distributed along a periphery of the respective vacuum nozzle.

In one embodiment, the cooling pipeline is wound inside the respective vacuum nozzle and is arranged close to the absorption surface of the respective vacuum nozzle.

In one embodiment, fins are spacedly arranged on a sidewall of the accommodation groove close to the absorption surface, and the cooling pores are respectively arranged corresponding to gaps between adjacent fins.

In one embodiment, the fins are arranged perpendicular to the sidewall of the accommodation groove.

In one embodiment, an end of the manipulator pad is provided with a guide chamfer.

In one embodiment, the guide chamfer is a guide bevel or a guide fillet.

In one embodiment, the vacuum nozzles are detachably connected with the manipulator pad.

In one embodiment, the manipulator pad defines therein a hollow-out groove.

In one embodiment, the hollow-out groove is a rectangular groove.

In one embodiment, the vacuum nozzles are uniformly distributed on the manipulator pad.

The present application further provides a vacuum absorption assembly, and the vacuum absorption assembly comprises:
a manipulator pad;
vacuum nozzles, disposed on the manipulator pad and configured to absorb a substrate;
a cooling component, disposed in a respective vacuum nozzle and configured to cool the respective vacuum nozzle;
an accommodation groove, defined in the respective vacuum nozzle and configured to accommodate the cooling component; and
a cooling medium, filled within the cooling component and configured to cool the cooling component. The cooling medium comprises cooling gas, the cooling component is a cooling pipeline having a plurality of ventilation pores, and the respective vacuum nozzle defines therein exhaust holes configured to exhaust internal gas; and the cooling pipeline is wound inside the respective vacuum nozzle and is arranged close to the absorption surface of the respective vacuum nozzle.

In one embodiment, the cooling pipeline defines therein cooling pores configured to blow gas towards an absorption surface of the respective vacuum nozzle, and the respective vacuum nozzle defines therein exhaust openings configured to exhaust internal gas.

In one embodiment, the exhaust openings are uniformly distributed along a periphery of the respective vacuum nozzle.

In one embodiment, fins are spacedly arranged on a sidewall of the accommodation groove close to the absorption surface, and the cooling pores are respectively arranged corresponding to gaps between adjacent fins.

In one embodiment, the fins are arranged perpendicular to the sidewall of the accommodation groove.

In one embodiment, an end of the manipulator pad is provided with a guide chamfer.

The present application further provides a manipulator device, and the manipulator device comprises a vacuum absorption assembly; the vacuum absorption assembly comprises:
a manipulator pad;
vacuum nozzles, disposed on the manipulator pad and configured to absorb a substrate; and a cooling component, disposed in a respective vacuum nozzle and configured to cool the respective vacuum nozzle;

an accommodation groove, defined in the respective vacuum nozzle and configured to accommodate the cooling component;

a cooling medium, filled within the cooling component and configured to cool the cooling component.

In the vacuum absorption assembly provided by the present application, by arranging the cooling component inside the respective vacuum nozzle and introducing the cooling medium into the cooling component, the manipulator pad in the baking machine is continuously cooled when it is ready to transport another substrate, such that it is ensured a temperature difference will not be produced on such substrate when the vacuum nozzle on the manipulator pad contacts with the substrate, the transport process will not result in uneven thickness of the film, thus ensuring the quality of the product.

The manipulator device of the present application is adapted to the transportation of the substrate for a display device into the soft baking machine for baking after the photoresist coating. When transporting the substrate into the baking machine, the manipulator pad of the manipulator device will have its temperature increase due to the heat transfer in the baking machine, in such case, the manipulator pad of the manipulator device has a relatively high temperature. When the manipulator device returns to transport another substrate which just finishes the coating, the manipulator pad is cooled, which ensures that a temperature difference will not be produced on the another substrate during the contact, thus avoiding uneven thickness of the film resulting from the temperature difference and uneven brightness and speckle in use.

DESCRIPTION OF THE PREFERRED EMBODIMENTS

Figure 1:
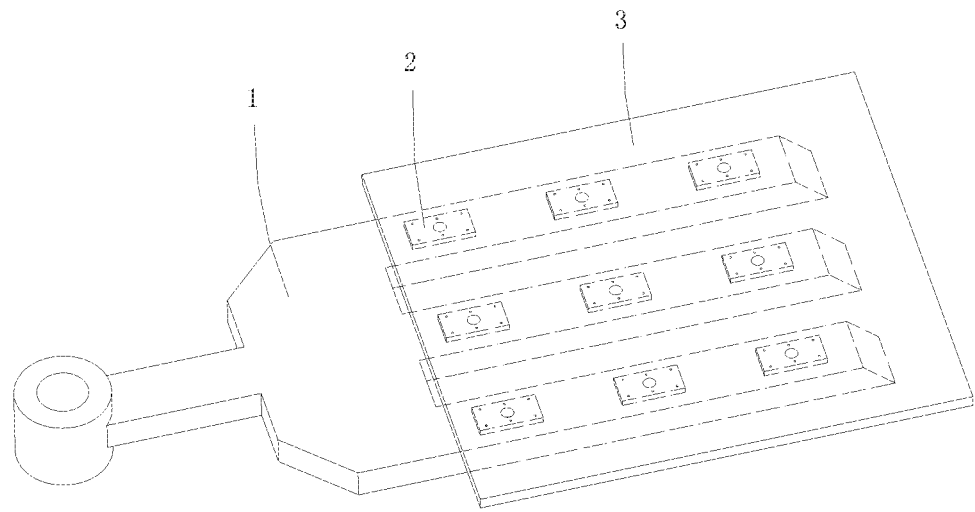
FIG. 1 is a schematic structural view of a use state of a vacuum absorption assembly according to an embodiment of the present application.

In order to make the technical problems to be solved, technical solutions, and beneficial effects by the present application more clear, the present application will be further described in detail below with reference to the accompanying drawings and embodiments. It should be understood that the specific embodiments described herein are merely intend to explain but not to limit the present application.

It should be noted that when an element is referred to as being "fixed" or "arranged" at/in/on another element, it can be directly at/in/on the other element. When an element is referred to as being "connected" to/with another element, it can be directly or indirectly connected to/with the other element.

It should be understood that terms "length", "width", "upper", "lower", "front", "rear", "left", "right", "vertical", "horizontal", "top", "bottom", "inside", "outside" and the like indicating orientation or positional relationship are based on the orientation or the positional relationship shown in the drawings, and are merely for facilitating and simplifying the description of the present application, rather than indicating or implying that a device or component must have a particular orientation, or be configured or operated in a particular orientation, and thus should not be construed as limiting the application.

Referring to FIGS. 1-4 and 6, the vacuum absorption assembly provided by the present application is described hereinbelow. The vacuum absorption assembly comprises: a manipulator pad 1; vacuum nozzles 2, disposed on the manipulator pad 1 and configured to absorb a substrate 3; and a cooling component, disposed in each of the vacuum nozzles 2 and configured to cool the vacuum nozzle 2. Each vacuum nozzle 2 defines therein an accommodation groove for installing the cooling component, and a cooling medium is introduced into the cooling component.

In the vacuum absorption assembly provided by the present application, by arranging the cooling component inside the respective vacuum nozzle and introducing the cooling medium into the cooling component, the manipulator pad 1 in the baking machine is continuously cooled when it is ready to transport another substrate 3, such that it is ensured a temperature difference will not be produced on such substrate 3 when the vacuum nozzle 2 on the manipulator pad 1 contacts with the substrate 3, the transport process will not result in uneven thickness of the film, thus ensuring the quality of the product.

Figure 3:
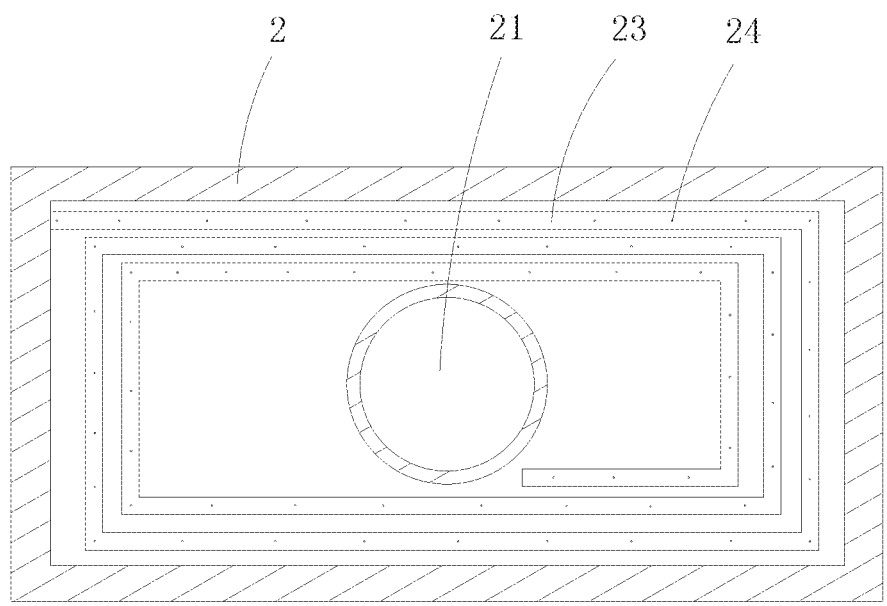
FIG. 3 is a top cross-sectional schematic view of the vacuum nozzle according to an embodiment of the present application.
Figure 4:
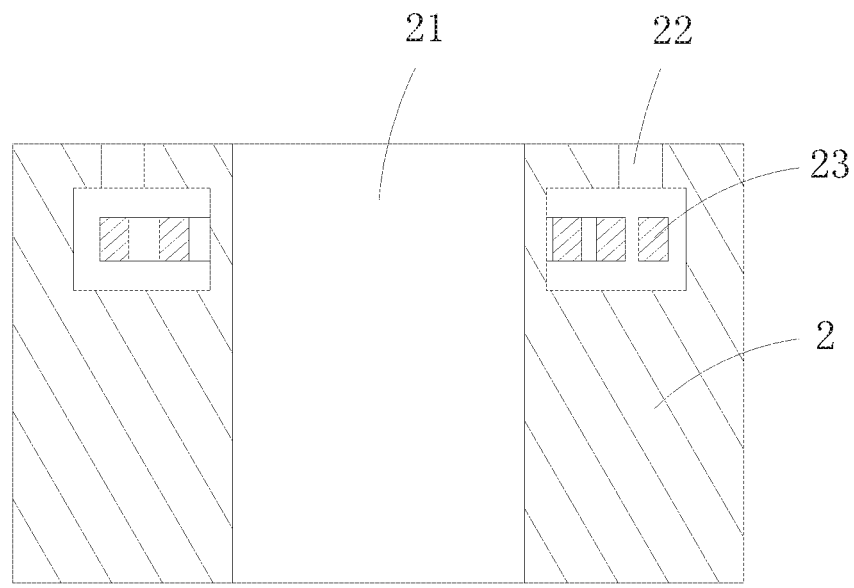
FIG. 4 is a first left cross-sectional schematic view of the vacuum nozzle according to an embodiment of the present application.

In one embodiment, referring to FIGS. 3-4, as a specific mode for carrying out the vacuum absorption assembly provided by the present application, the cooling component is a cooling pipeline 23, and the cooling medium is cooling gas. A middle part of the vacuum nozzle 2 is provided with a suction hole, configured to absorb the substrate 3. The inner part of the vacuum nozzle 2 is provided with the accommodation groove configured for accommodating the cooling pipeline 23, the cooling pipeline 23 is in communication with a gas source, and the cooling gas is introduced from the gas source into the cooling pipeline 23. In this way, the cooling gas is adopted for cooling, the use is convenient, and the cooling effect is good.

Figure 2:
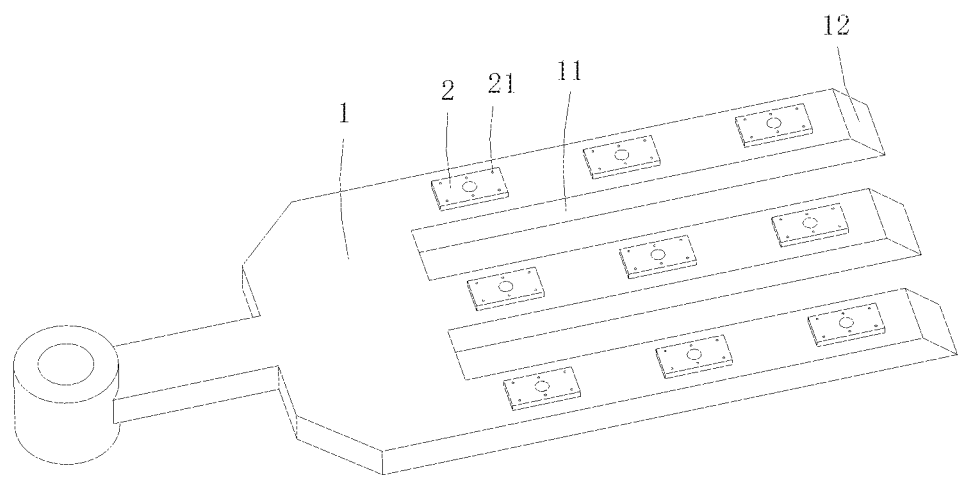
FIG. 2 is a schematic structural view of a vacuum absorption assembly according to an embodiment of the present application.

In one embodiment, referring to FIGS. 1, 2, and 4, as a specific mode for carrying out the vacuum absorption assembly provided by the present application, the cooling pipeline 23 defines therein cooling pores 24 configured to blow gas towards an absorption surface of the respective vacuum nozzle 2, and the respective vacuum nozzle 2 defines therein exhaust openings 22 configured to exhaust internal gas. The cooling pores 24 of the cooling pipeline 23 continuously blow gas towards the absorption surface of the respective vacuum nozzle 2, such that the heat exchange is performed, the heat quantity of the vacuum nozzle 2 is carried away and discharged to the external, and the cooling effect is good.

Specifically, referring to FIGS. 1, 2, and 4, as a specific mode for carrying out the vacuum absorption assembly provided by the present application, the exhaust openings 22 are arranged at corners of the vacuum nozzle 2, which facilitates the gas exhaust and the heat dissipation. Optionally, the exhaust openings are arranged along a periphery of the respective vacuum nozzle 2, and are uniformly distributed along the periphery of the respective vacuum nozzle 2, which makes the heat dissipation more uniform, and the use effect is good.

In one embodiment, referring to FIGS. 1-4, as a specific mode for carrying out the vacuum absorption assembly provided by the present application, the cooling pipeline 23 is wound inside the vacuum nozzle 2 and is arranged close to the absorption surface of the respective vacuum nozzle 2. The winding arrangement of the cooling pipeline 23 increases the gas input and the gas output, the efficiency of heat exchange is high, and the use effect is good.

Figure 5:
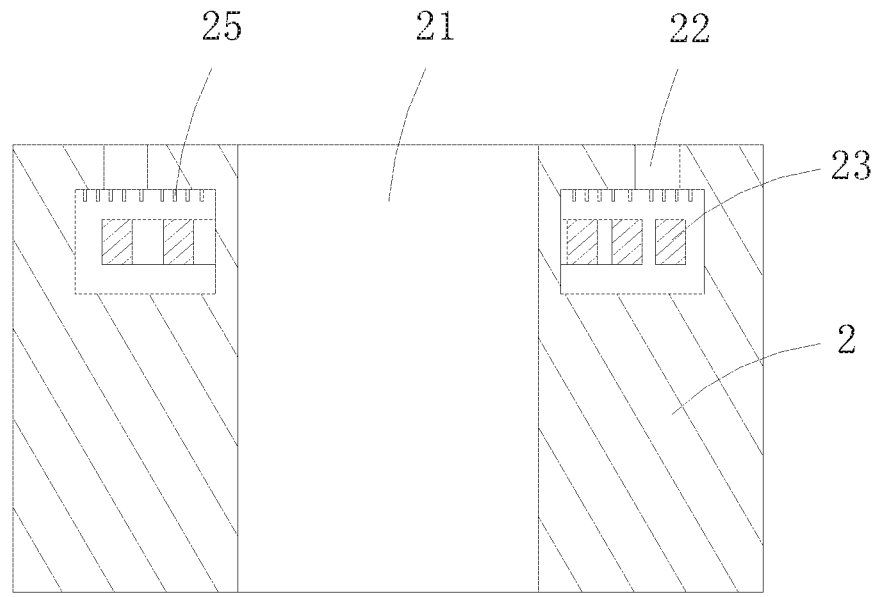
FIG. 5 is a second left cross-sectional schematic view of the vacuum nozzle according to an embodiment of the present application.
Figure 6:
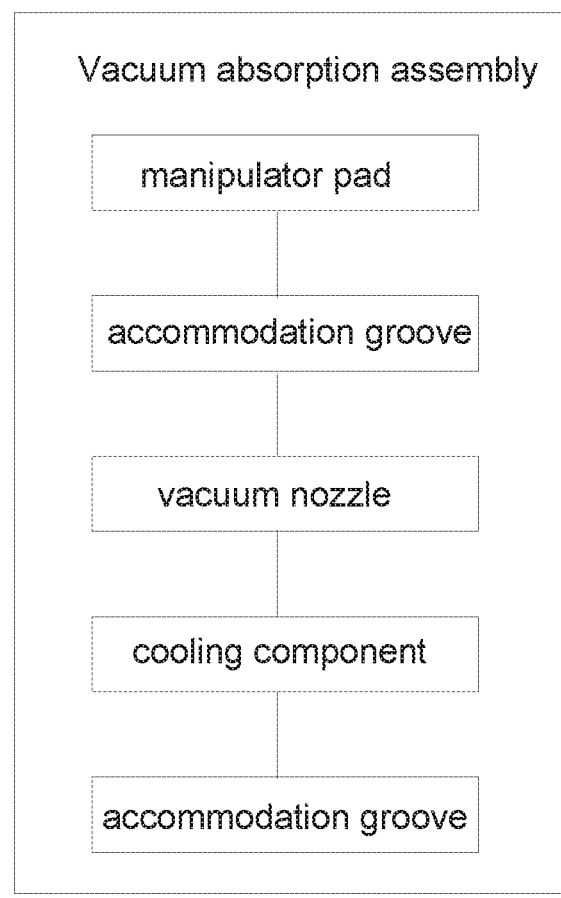
FIG. 6 is a structural block diagram of a vacuum absorption assembly according to an embodiment of the present application.

In one embodiment, referring to FIG. 5, as a specific mode for carrying out the vacuum absorption assembly provided by the present application, fins 25 are spacedly arranged on a sidewall of the accommodation groove close to the absorption surface, and the cooling pores 24 are respectively arranged corresponding to gaps between adjacent fins 25. The arrangement of the fins increases the area for heat dissipation, and improves the heat dissipation efficiency. The fins are arranged perpendicular to the sidewall of the accommodation groove, which is convenient for processing and fabrication, conducive to the flowing of cooling gas, and has good heat dissipation effect.

In one embodiment, as a specific mode for carrying out the vacuum absorption assembly provided by the present application, the cooling gas is dry air or nitrogen. The dry air or nitrogen is common gas, the raw material of which is easily available and pollution free, particularly for the nitrogen, the compressed nitrogen has lower temperature and better cooling effect when being used for cooling.

In one embodiment, as a specific mode for carrying out the vacuum absorption assembly provided by the present application, the cooling component is a cooling water pipe, and the cooling medium is cooling water. By using the cooling water pipe to cool the vacuum nozzle 2, cooling effect can be obtained and the noise is small.

In one embodiment, referring to FIGS. 1-2, as a specific mode for carrying out the vacuum absorption assembly provided by the present application, the manipulator pad 1 defines therein a hollow-out groove 11. The arrangement of the hollow-out groove 11 facilitates the vacuum absorption and vacuum breaking, and makes a contact interface between the manipulator pad 1 and the substrate 3 small, such that the contact therebetween is much stable, the absorption is much tighter, and the vacuum absorption is much stable.

In one embodiment, referring to FIGS. 1-2, as a specific mode for carrying out the vacuum absorption assembly provided by the present application, the hollow-out groove 11 is a rectangular groove. The rectangular groove is convenient for processing and fabrication as well as the arrangement of the vacuum nozzles 2 on the manipulator pad.

In one embodiment, referring to FIGS. 1-2, as a specific mode for carrying out the vacuum absorption assembly provided by the present application, an end of the manipulator pad 1 is provided with a guide chamfer 12. The guide chamfer 12 is a guide bevel or a guide fillet. The arrangement of the guide chamfer 12 is convenient for the manipulator pad 1 to pick up and place the substrate 3 without damaging the substrate 3.

In one embodiment, referring to FIGS. 1-2, as a specific mode for carrying out the vacuum absorption assembly provided by the present application, the vacuum nozzles 2 are uniformly distributed on the manipulator pad 1. The uniform arrangement of the vacuum nozzles 2 results in good absorption effect and stable and reliable transport process.

In one embodiment, as a specific mode for carrying out the vacuum absorption assembly provided by the present application, the vacuum nozzles 2 are detachably connected with the manipulator pad 1, which is convenient for the installation and replacement of the vacuum nozzle 2, specifically, the vacuum nozzles 2 are fixed on the manipulator pad 1 via screws. The screws are standard parts, which is convenient for purchase, and has low production cost and good connection effect.

As to the vacuum absorption assembly, in the specific application, the cooling pipeline 23 is arranged in the respective vacuum nozzle 2, the cooling medium is the cooling gas. The cooling pipeline 23 is wound inside the vacuum nozzle 2, which not only enlarges the contact surface between the cooling pipeline 23 and the vacuum nozzle 2, but also increases the gas input of the cooling gas. The cooling pipeline 23 is in communication with the gas source, and the cooling gas is introduced from the gas source into the cooling pipeline 23. The cooling pipeline 23 defines therein the cooling pores 24 which are configured to blow gas towards the absorption surface of the respective vacuum nozzle 2, and the respective vacuum nozzle 2 also defines therein the exhaust openings 22 configured to exhaust internal gas. Because the winding arrangement of the cooling pipeline 23, a relatively large amount of exhaust openings 22 can be arranged, so as to increase the flow of the cooling gas. A large amount of the gas exchanges heat with the vacuum nozzle 2 during the flowing process thereof, which carries away the heat from the vacuum nozzle, and realizes the purpose of cooling the vacuum nozzle 2. In the meanwhile, the manipulator pad 1 is also cooled, it is therefore ensured that no temperature difference will be generated on the vacuum nozzles 2 of the manipulator pad 1 when the they contact with a next substrate 3, thus improving the product quality and qualified rate of the substrate.

During the process that the manipulator pad 1 in the baking machine is ready to transport another substrate 3, the cooling gas, optionally, the cooling air or the cooling nitrogen, is introduced from the gas source to the cooling pipeline 23, besides, the cooling air or the cooling nitrogen is dry gas, because the cooling is continuously performed by the cooling gas, it is ensured that no temperature difference will be generated on the vacuum nozzles 2 of the manipulator pad 1 when the vacuum nozzles 2 contact with a next substrate 3, which is convenient in use and has good cooling effect, and ensures a normal temperature at any time the manipulator pad contacting with the substrate during the transport process, the uneven thickness of the film resulting from the too high temperature is avoided, and the production quality of the substrate is improved, thereby being conducive to improve the quality and the qualified rate of the display device.

The present application further provides a vacuum absorption assembly, referring to FIGS. 1-4, the vacuum absorption assembly comprises: a manipulator pad 1, vacuum nozzles 2, arranged on the manipulator pad 1 and configured to absorb a substrate 3; and a cooling component, arranged in the respective vacuum nozzle 2 and configured to cool the respective vacuum nozzle 2. The vacuum nozzle 2 defines therein an accommodation groove for installing the cooling component, and a cooling medium is introduced into the cooling component. The cooling component is a cooling pipeline having a plurality of ventilation pores, and the respective vacuum nozzle defines therein exhaust holes configured to exhaust internal gas. The cooling pipeline is wound inside the respective vacuum nozzle and is arranged close to the absorption surface of the vacuum nozzle. The cooling medium comprises cooling gas, optionally, the cooling gas is cooling air or cooling nitrogen.

In the vacuum absorption assembly provided by the present application, the cooling medium is introduced into the cooling component arranged in the vacuum nozzle 2, the cooling medium may optionally be a dry cooling gas, which has easily available raw material, pollution free use, and good cooling effect. When the manipulator pad 1 leaves baking machine and is ready to transport another substrate 3, the vacuum nozzle is continuously cooled by the cooling gas, which ensures that a temperature difference will not be produced on the another substrate 3 when the vacuum nozzle 2 on the manipulator pad 1 contacts with the another substrate 3, the transport process will not result in uneven thickness of the film, thus ensuring the quality of the product.

The present application further provides a manipulator device, which comprises the above vacuum absorption assembly.

The manipulator device of the present application adopts the above vacuum absorption assembly, which ensures that a temperature difference will not be produced on a next substrate 3 when the vacuum nozzle 2 on the manipulator pad 1 contacts with the next substrate 3, the transport process will not result in uneven thickness of the film, thus ensuring the quality of the product.

The manipulator device of the present application is adapted to the transportation of the substrate 3 for a display device into the soft baking machine for baking after the photoresist coating. When transporting the substrate 3 into the baking machine, the manipulator pad 1 of the manipulator device will have its temperature increase due to the heat transfer in the baking machine, in such case, the manipulator pad of the manipulator device has a relatively high temperature. When the manipulator device returns to transport another substrate which just finishes the coating, the manipulator pad 1 is cooled, which ensures that a temperature difference will not be produced on the another substrate 3 during the contact, thus avoiding uneven thickness of the film resulting from the temperature difference and uneven brightness and speckle in use.

The substrate 3 may be a glass substrate or a flexible substrate, which is not limited thereto.

In some embodiments, the display device can be, for example, an Liquid Crystal Display (LCD) display device, an Organic Light-Emitting Diode (OLED) display device, a Quantum Dot Light Emitting Diode (QLED) display device, a curved display device, or other display device.

The above description is only the preferred embodiment of the present application, and is not intended to limit the present application. Any modifications, equivalent substitutions, and improvements made within the spirit and principles of the present application are included in the protection scope of the present application.

What is claimed is:

1. A vacuum absorption assembly, comprising:
   a manipulator pad;
   vacuum nozzles, disposed on the manipulator pad and configured to absorb a substrate;
   a cooling component, disposed in a respective vacuum nozzle and configured to cool the respective vacuum nozzle;
   an accommodation groove, defined in the respective vacuum nozzle and configured to accommodate the cooling component; and
   a cooling medium, filled within the cooling component and configured to cool the cooling component;
   wherein the cooling component is a cooling pipeline, and the cooling medium comprises cooling gas.

2. The vacuum absorption assembly of claim 1, wherein the cooling pipeline defines therein cooling pores configured to blow gas towards an absorption surface of the respective vacuum nozzle, and the respective vacuum nozzle defines therein exhaust openings configured to exhaust internal gas.

3. The vacuum absorption assembly of claim 2, wherein the exhaust openings are uniformly distributed along a periphery of the respective vacuum nozzle.

4. The vacuum absorption assembly of claim 2, wherein the cooling pipeline is wound inside the respective vacuum nozzle and is arranged close to the absorption surface of the respective vacuum nozzle.

5. The vacuum absorption assembly of claim 4, wherein the fins are arranged perpendicular to the sidewall of the accommodation groove.

6. The vacuum absorption assembly of claim 2, wherein fins are spacedly arranged on a sidewall of the accommodation groove close to the absorption surface, and the cooling pores are respectively arranged corresponding to gaps between adjacent fins.

7. The vacuum absorption assembly of claim 1, wherein an end of the manipulator pad is provided with a guide chamfer.

8. The vacuum absorption assembly of claim 7, wherein the guide chamfer is a guide bevel or a guide fillet.

9. The vacuum absorption assembly of claim 1, wherein the vacuum nozzles are detachably connected with the manipulator pad.

10. The vacuum absorption assembly of claim 1, wherein the manipulator pad defines therein a hollow-out groove.

11. The vacuum absorption assembly of claim 10, wherein the hollow-out groove is a rectangular groove.

12. The vacuum absorption assembly of claim 1, wherein the vacuum nozzles are uniformly distributed on the manipulator pad.

13. A vacuum absorption assembly, comprising:
    a manipulator pad;
    vacuum nozzles, disposed on the manipulator pad and configured to absorb a substrate;
    a cooling component, disposed in a respective vacuum nozzle and configured to cool the respective vacuum nozzle;
    an accommodation groove, defined in the respective vacuum nozzle and configured to accommodate the cooling component; and
    a cooling medium, filled within the cooling component and configured to cool the cooling component;
    wherein the cooling medium comprises cooling gas, the cooling component is a cooling pipeline having a plurality of ventilation pores, and the respective vacuum nozzle defines therein exhaust holes configured to exhaust internal gas; and the cooling pipeline is wound inside the respective vacuum nozzle and is arranged close to the absorption surface of the respective vacuum nozzle.

14. The vacuum absorption assembly of claim 13, wherein the cooling pipeline defines therein cooling pores configured to blow gas towards an absorption surface of the respective vacuum nozzle, and the respective vacuum nozzle defines therein exhaust openings configured to exhaust internal gas.

15. The vacuum absorption assembly of claim 14, wherein the exhaust openings are uniformly distributed along a periphery of the respective vacuum nozzle.

16. The vacuum absorption assembly of claim 13, wherein fins are spacedly arranged on a sidewall of the accommodation groove close to the absorption surface, and the cooling pores are respectively arranged corresponding to gaps between adjacent fins.

17. The vacuum absorption assembly of claim 16, wherein the fins are arranged perpendicular to the sidewall of the accommodation groove.

18. The vacuum absorption assembly of claim 13, wherein an end of the manipulator pad is provided with a guide chamfer.

19. A manipulator device, comprising:
a vacuum absorption assembly;
wherein the vacuum absorption assembly comprises:
a manipulator pad;
vacuum nozzles, disposed on the manipulator pad and configured to absorb a substrate; and
a cooling component, disposed in a respective vacuum nozzle and configured to cool the respective vacuum nozzle;
an accommodation groove, defined in the respective vacuum nozzle and configured to accommodate the cooling component;
a cooling medium, filled within the cooling component and configured to cool the cooling component;
wherein the cooling component is a cooling pipeline, and the cooling medium comprises cooling gas.

* * * * *